(12) United States Patent
Maeda et al.

(10) Patent No.: US 10,617,997 B1
(45) Date of Patent: Apr. 14, 2020

(54) APPARATUS FOR EXHAUST GAS ABATEMENT UNDER REDUCED PRESSURE

(71) Applicant: Kanken Techno Co., Ltd., Nagaokakyo-shi, Kyoto (JP)

(72) Inventors: Masashi Maeda, Nagaokakyo (JP); Akihisa Yoshida, Nagaokakyo (JP); Michihiko Yanagisawa, Nagaokakyo (JP); Tsutomu Tsukada, Nagaokakyo (JP); Hiroshi Imamura, Nagaokakyo (JP)

(73) Assignee: KANKEN TECHNO CO., LTD., Kyoto (JP)

( * ) Notice: Subject to any disclaimer, the term of this patent is extended or adjusted under 35 U.S.C. 154(b) by 0 days.

(21) Appl. No.: 16/603,959

(22) PCT Filed: May 2, 2018

(86) PCT No.: PCT/JP2018/017529
§ 371 (c)(1),
(2) Date: Oct. 9, 2019

(87) PCT Pub. No.: WO2018/216446
PCT Pub. Date: Nov. 29, 2018

(30) Foreign Application Priority Data

May 24, 2017 (JP) .................................. 2017-102711

(51) Int. Cl.
*B01D 53/68* (2006.01)
*F23G 7/06* (2006.01)
(Continued)

(52) U.S. Cl.
CPC .............. *B01D 53/68* (2013.01); *F23G 7/06* (2013.01); *B01D 53/005* (2013.01); *B01D 53/76* (2013.01);
(Continued)

(58) Field of Classification Search
None
See application file for complete search history.

(56) References Cited

U.S. PATENT DOCUMENTS

2012/0090338 A1* 4/2012 Czerniak ................ B01D 53/79
62/91

FOREIGN PATENT DOCUMENTS

CN 2420504 Y 2/2001
JP H11-333247 A 12/1992
(Continued)

OTHER PUBLICATIONS

International Search Report dated Jul. 17, 2018 for Application No. PCT/JP2018/017529 and English translation.
(Continued)

*Primary Examiner* — Walter D. Griffin
*Assistant Examiner* — Jelitza M Perez
(74) *Attorney, Agent, or Firm* — Lucas & Mercanti, LLP (57) ABSTRACT

An apparatus for exhaust gas abatement under reduced pressure includes a reaction tube having, in an interior thereof, an exhaust gas treatment space in which an exhaust gas supplied from an exhaust gas source via a vacuum pump is heated by an electric heater or excited by a plasma for decomposition and/or reaction treatment. The apparatus also includes a downstream vacuum pump connected to an exhaust gas outlet located downstream of the reaction tube to reduce a pressure in a region located downstream of an outlet of the vacuum pump and including the interior of the reaction tube. The downstream vacuum pump is a water-sealed pump. The apparatus further includes a water-washing unit for washing a downstream end of an exhaust gas flow path in the reaction tube with washing water. The washing water supplied by the water-washing unit is reused as seal water for the downstream vacuum pump.

5 Claims, 4 Drawing Sheets

(51) Int. Cl.
    *B01D 53/00*      (2006.01)
    *B01D 53/76*      (2006.01)
    *C23C 16/44*      (2006.01)
(52) U.S. Cl.
    CPC .............. *B01D 2257/553* (2013.01); *B01D 2258/0216* (2013.01); *B01D 2259/818* (2013.01); *C23C 16/4412* (2013.01)

(56) References Cited

FOREIGN PATENT DOCUMENTS

| | | | |
|---|---|---|---|
| JP | 2000317265 | A | 11/2000 |
| JP | 2000323414 | A | 11/2000 |
| JP | 2002263475 | A | 9/2002 |
| JP | 2004209373 | A | 7/2004 |
| JP | 2010037631 | A | 2/2010 |
| TW | I361102 | B | 4/2012 |
| TW | M495894 | U | 2/2015 |

OTHER PUBLICATIONS

Office Action dated Jan. 17, 2019 for corresponding Taiwanese Application No. 107116727 (Taiwanese only).

* cited by examiner

APPARATUS FOR EXHAUST GAS ABATEMENT UNDER REDUCED PRESSURE

CROSS REFERENCE TO RELATED APPLICATION

This Application is a 371 of PCT/JP2018/017529 filed on May 2, 2018 which in turn, claimed the priority of Japanese Patent Applications No. 2017-102711 filed on May 24, 2017, both applications are incorporated herein by reference.

TECHNICAL FIELD

The present invention relates to an exhaust gas abatement apparatus suitable for treatment of harmful exhaust gases such as combustible gases, toxic gases, and greenhouse gases emitted in the manufacturing processes mainly in the electronics industry.

BACKGROUND ART

In the electronics industry for manufacturing semiconductors, liquid crystals, etc., various CVD processes are used for producing various films such as silicon nitride films, silicon oxide films, silicon oxynitride films, TEOS oxide films, high dielectric constant films, low dielectric constant films, and metal films.

Among these, for example, silicon-based thin films are formed by a CVD method mainly using an explosive and toxic silane-based gas. In this CVD method, after being used in a CVD process, the used process gas as an exhaust gas containing the above-mentioned silane-based gas is rendered harmless in an abatement apparatus as described in Patent Literature 1 below. It is conventional practice to dilute the silane-based gas in the exhaust gas with a large amount of diluent nitrogen gas introduced upstream of the abatement apparatus so as to reduce the concentration of the silane-based gas to a level lower than the lower explosive limit.

Here, in a typical CVD process for forming silicon oxynitride films, $SiH_4/NH_3/N_2O=1$ slm/10 slm/10 slm (slm: standard liter per minute, i.e., a unit of flow rate of a gas at 0° C. and 1 atm expressed in terms of liters per minute) is used. Since the explosion range of $SiH_4$ is 1.3% to 100%, the gas mixture emitted in this CVD process must be diluted with about 76 parts of diluent nitrogen gas immediately after the emission. After the dilution, a conventional pyrolysis (thermal decomposition) apparatus, for example, a combustion type pyrolysis apparatus or an atmospheric plasma type pyrolysis apparatus can be used to perform abatement treatment safely and reliably.

CITATION LIST

Patent Literature

[PTL 1] Japanese Laid-Open Patent Publication No. 11-333247

SUMMARY OF INVENTION

Technical Problem

However, the above-described conventional technique has a problem.

Specifically, the energy required for heating the exhaust gas mixture containing a silane-based gas and nitrogen gas used to dilute the silane-based gas as described above to the decomposition temperature is about 76 times the energy required for heating only the exhaust gas containing the undiluted silane-based gas. This means that in the conventional abatement process that requires dilution with nitrogen gas, not only the exhaust gas but also the nitrogen gas that is not directly involved in the abatement of the exhaust gas must be heated and thus the energy efficiency decreases, resulting in an increase in the cost of electricity, fuels, etc., in addition to an increase in the cost of nitrogen gas used in large amounts.

It is therefore a primary object of the present invention to provide an energy-efficient and economically efficient apparatus that can achieve exhaust gas abatement with a minimum use of diluent nitrogen gas without sacrificing safety.

Solution to Problem

Figure 1:
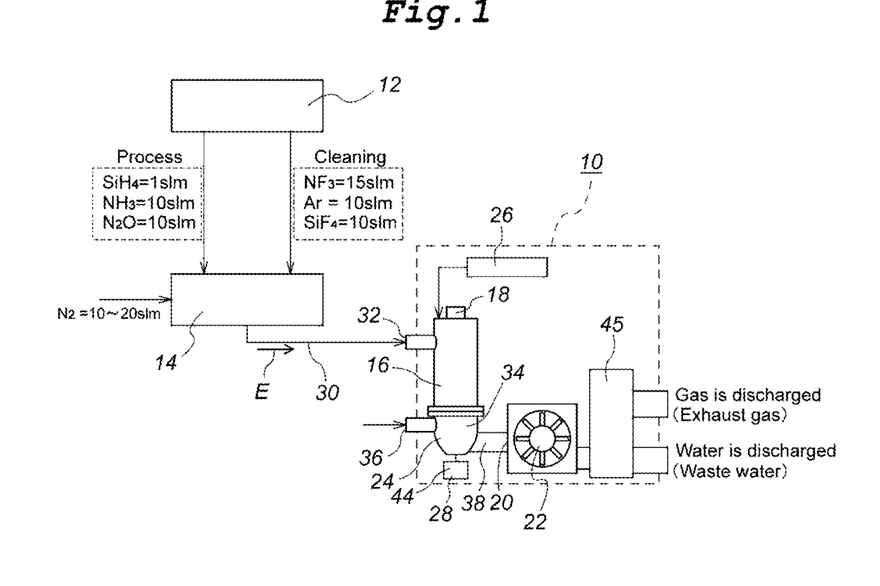
FIG. 1 is a block diagram showing an overview of an apparatus for exhaust gas abatement under reduced pressure according to an embodiment (first embodiment) of the present invention.
Figure 2:
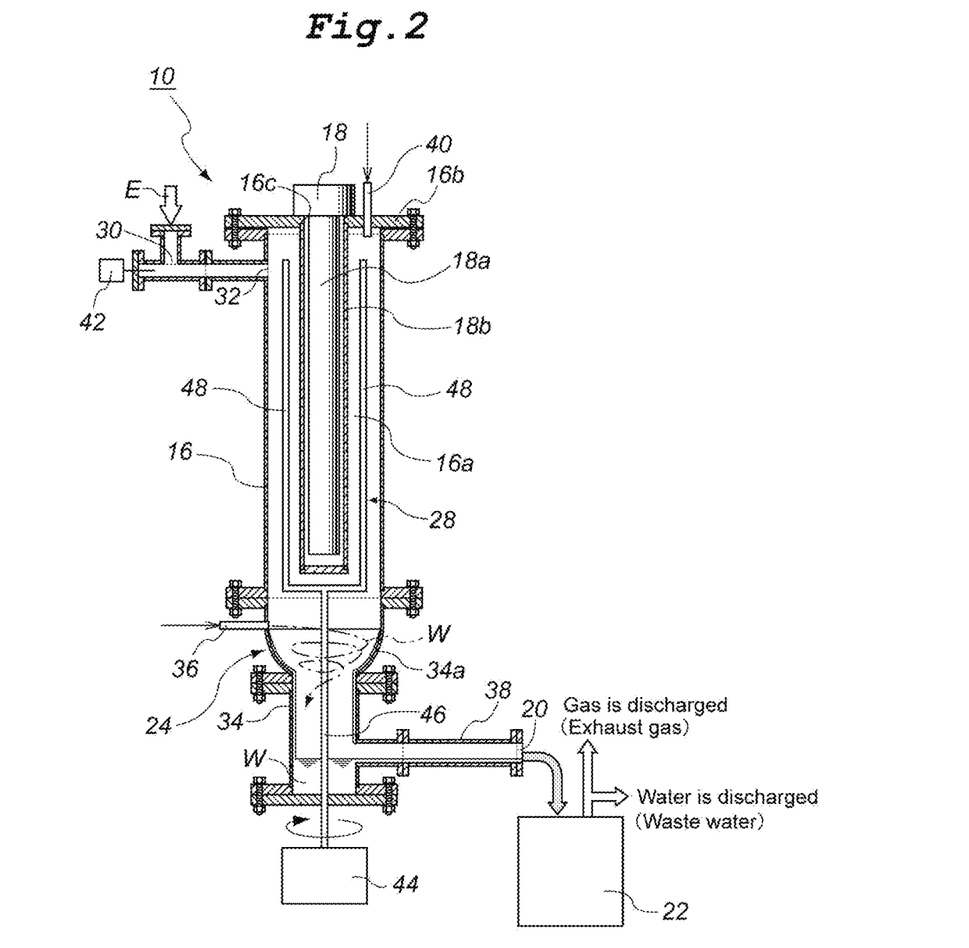
FIG. 2 is a partial cross-sectional front view showing an example of a reaction tube of the apparatus for exhaust gas abatement under reduced pressure according to the present invention.

In order to achieve the above object, according to the present invention, exhaust gas abatement is performed under reduced pressure. More specifically, the apparatus for exhaust gas abatement under reduced pressure according to the present invention is configured as follows, for example, as shown in FIG. 1 and FIG. 2.

The apparatus for exhaust gas abatement under reduced pressure according to the present invention includes a reaction tube 16 having, in an interior thereof, an exhaust gas treatment space 16*a* in which an exhaust gas E supplied from an exhaust gas source 12 via a vacuum pump 14 is heated by an electric heater 18 or excited by a plasma for decomposition and/or reaction treatment. The apparatus also includes a downstream vacuum pump 22 that is connected to an exhaust gas outlet 20 located downstream of the reaction tube 16 to reduce a pressure in a region located downstream of an outlet of the vacuum pump 14 and including the interior of the reaction tube 16. The downstream vacuum pump 22 is a water-sealed pump. The apparatus further includes a water-washing unit 24 for washing a downstream end of an exhaust gas flow path in the reaction tube 16 with washing water W. The washing water W supplied by the water-washing unit 24 to wash the downstream end of the exhaust gas flow path in the reaction tube 16 is reused as seal water for the downstream vacuum pump 22.

This invention has, for example, the following advantageous effects.

Since the exhaust gas E supplied from the exhaust gas source 12 via the vacuum pump 14 is heated by the electric heater 18 for decomposition and/or reaction treatment under reduced pressure, less heat is generated by the reaction and a rapid temperature rise or explosive reaction never occurs. Therefore, there is no need for using diluent nitrogen gas or the use of nitrogen gas can be reduced to a minimum. Since there is no need to dilute with diluent nitrogen gas or the use of the nitrogen gas can be reduced to a minimum, almost all thermal energy supplied from the electric heater 18 can be used directly for decomposition and reaction of the exhaust gas E. In addition, since a region located downstream of the outlet of the exhaust gas E source and including the abatement treatment unit is under reduced pressure, even if the exhaust gas E contains toxic substances to humans, there is no risk that the exhaust gas E leaks from the system before being heated by the electric heater 18 for decomposition/reaction treatment.

Furthermore, since the apparatus includes the water-washing unit 24 for washing the downstream end of the exhaust gas flow path in the reaction tube 16 with washing water W, dust particles produced as a by-product of the thermal decomposition/reaction treatment of the exhaust gas E and deposited on the downstream end of the exhaust gas flow path in the reaction tube 16 can be washed away with the washing water W.

Furthermore, since the downstream vacuum pump 22 is a water-sealed pump and the washing water W supplied by the water-washing unit 24 to wash the downstream end of the exhaust gas flow path in the reaction tube 16 is reused as seal water for the downstream vacuum pump 22, the unit water consumption for the abatement of the exhaust gas E can be reduced.

Preferably, the apparatus according to the present invention further includes a decomposition/reaction agent supply unit 26 for supplying at least one selected from the group consisting of water, air, $O_2$, $H_2$, and hydrocarbon gases, as a decomposition/reaction agent, to the interior of the reaction tube 16.

In this case, even if the exhaust gas E mainly contains a large amount of combustible and harmful substances such as $SiH_4$ and $NF_3$, the addition of the decomposition/reaction agent allows these substances to be easily decomposed into stable substances or to be rendered harmless by reaction.

Preferably, the apparatus according to the present invention further includes a dust removal unit 28 that is provided in the interior of the reaction tube 16 to remove dust particles deposited therein.

In this case, the dust removal unit 28, in cooperation with the water-washing unit 24 mentioned above, can remove dust particles produced as a by-product of the thermal decomposition/reaction treatment of the exhaust gas E from the reaction tube 16 more effectively.

Preferably, the apparatus according to the present invention further includes an inlet-side scrubber 50 that is a wet scrubber for washing the exhaust gas E with water in a reduced pressure atmosphere before the exhaust gas E is introduced into the reaction tube 16.

In this case, the exhaust gas E can be washed with water before being introduced into the reaction tube 16 to remove dust particles and water-soluble components. In addition, water introduced with the exhaust gas E into the reaction tube 16 also acts as a decomposition/reaction agent.

In the case where the apparatus for exhaust gas abatement under reduced pressure according to the present invention includes the inlet-side scrubber 50 as described above, it is preferable that the apparatus further includes a circulation pump 54 for circulating scrubber water SW for use in the inlet-side scrubber 50 and a portion of the circulating scrubber water SW is supplied to the water-washing unit 24 for use as the washing water W therein.

In this case, the water use efficiency can be maximized and thus the unit water consumption can be reduced.

Advantageous Effects of the Invention

According to the present invention, it is possible to provide an energy-efficient and economically efficient apparatus that can achieve exhaust gas abatement with a minimum use of diluent nitrogen gas without sacrificing safety.

DESCRIPTION OF EMBODIMENTS

Hereinafter, an embodiment (first embodiment) of the present invention will be described with reference to FIG. 1 and FIG. 2.

FIG. 1 is a diagram showing an overview of an apparatus 10 for exhaust gas abatement under reduced pressure according to an embodiment of the present invention. As shown in FIG. 1, the apparatus 10 for exhaust gas abatement under reduced pressure according to this embodiment is an apparatus for abatement of an exhaust gas E supplied from an exhaust gas source 12 such as a CVD apparatus via a vacuum pump 14, and includes a reaction tube 16 and a downstream vacuum pump 22.

Here, the embodiment of FIG. 1 shows a silicon oxynitride film CVD apparatus as an example of the exhaust gas source 12. In a typical silicon oxynitride film CVD apparatus, $SiH_4/NH_3/N_2O=1$ slm/10 slm/10 slm is used as a process gas, and $NF_3/Ar=15$ slm/10 slm is used as a cleaning gas. It is presumed that $SiF_4$ as a product of the cleaning reaction is emitted at about 10 slm. A mixture of these spent gases is supplied as the exhaust gas E to the apparatus 10 for abatement under reduced pressure via the vacuum pump 14. It should be noted that in a semiconductor device manufacturing process such as a CVD process for forming silicon oxynitride films, a dry pump is mainly used as the vacuum pump 14. Therefore, $N_2$ (nitrogen gas) supplied to this vacuum pump 14 is purging $N_2$ supplied to seal the shaft of the vacuum pump 14.

The reaction tube 16 is a cylindrical tubular body formed of, for example, a corrosion-resistant metallic material such as Hastelloy (registered trademark) and mounted upright with its axis vertical (see FIG. 2). The upper end portion of the outer wall of this reaction tube 16 is provided with an exhaust gas inlet 32 communicating with the outlet of the vacuum pump 14 through a pipe 30. In FIG. 2, a reference numeral 42 denotes a vacuum gauge mounted in the pipe 30 to measure the degree of vacuum in the reaction tube 16.

An exhaust gas treatment space 16a is formed in the interior of the reaction tube 16, and as a heat source, an electric heater 18 described below is installed therein.

Furthermore, a water-washing unit 24 is connected in series to the downstream end of the exhaust gas flow path in the reaction tube 16, that is, at the lower end portion of the reaction tube 16, so as to form a single unit with the reaction tube 16.

The water-washing unit 24 is configured to wash away dust particles produced as a by-product of thermal decomposition/reaction treatment of the exhaust gas E in the exhaust gas treatment space 16a and deposited on the lower end portion of the reaction tube 16, with the washing water W. Like the reaction tube 16, the water-washing unit 24 is also formed of, for example, a corrosion-resistant metallic material such as Hastelloy (registered trademark) and includes: a casing 34 having a funnel-shaped tapered portion 34a with an inner diameter gradually decreasing downward from the lower end portion of the reaction tube 16; and a washing water supply nozzle 36 provided at the upper end portion of the tapered portion 34a so as to supply the washing water W in such a manner that the water W flows spirally downward along the inner surface of the tapered portion 34a.

A pipe 38 communicating with the exhaust gas outlet 20 is connected to the lower end portion of the outer wall of the casing 34 of the water-washing unit 24, and an inlet of the downstream vacuum pump 22 is connected directly to the exhaust gas outlet 20 as the downstream end of the pipe 38. Therefore, the washing water W supplied from the water-washing unit 24, together with the exhaust gas E that has undergone thermal decomposition treatment, is provided to the downstream vacuum pump 22 through the exhaust gas outlet 20.

A nozzle 40 for introducing at least one decomposition/reaction agent selected from the group consisting of water, air, $O_2$, $H_2$ and hydrocarbon gases, which are optionally supplied from the decomposition/reaction agent supply unit 26, into the exhaust gas treatment space 16a is provided in the vicinity of the exhaust gas inlet 32 located on the opposite side to the lower end of the reaction tube 16 at which the water-washing unit 24 is connected in series, i.e., located on the upper part of the reaction tube 16 (see FIG. 2).

Furthermore, a heater insertion hole 16c is formed in the central portion of a top panel 16b of the reaction tube 16, and the electric heater 18 is disposed in the reaction tube 16 through the heater insertion hole 16c.

The electric heater 18 is configured to heat the exhaust gas treatment space 16a to a predetermined temperature equal to or higher than the thermal decomposition temperature (more specifically, about 600° C. to 1300° C.) of the exhaust gas E (i.e., components to be abated, in particular) so as to thermally decompose the exhaust gas E, and includes a heating element 18a and a protective tube 18b.

When electric power is applied, the heating element 18a generates heat at a temperature equal to or higher than the thermal decomposition temperature of the exhaust gas E and serves as a heat source of the electric heater 18. Examples of the heating element 18a include a solid or hollow silicon carbide rod and a spirally wound metallic wire rod obtained by bending a metallic wire such as a nichrome wire or a kanthal wire into two halves approximately parallel to each other at the center C in its longitudinal direction and then spirally winding them. The outer surface of this heating element 18a is protected by the protective tube 18b.

The protective tube 18b is a bottomed tubular container made of a ceramic material such as alumina ($Al_2O_3$), silica ($SiO_2$) or silicon nitride ($Si_3N_4$) or a corrosion-resistant metallic material such as Hastelloy (registered trademark).

The downstream vacuum pump 22 is a pump for reducing the pressure in the region located downstream of the outlet of the vacuum pump 14 and including the interior of the reaction tube 16 to a predetermined degree of vacuum and drawing the exhaust gas E that has undergone abatement treatment in the reaction tube 16 to discharge it. In the present invention, a water-sealed pump is used as the downstream vacuum pump 22. A "water-sealed pump (i.e., a water seal type vacuum pump)" is a vacuum pump including a casing containing an appropriate amount of seal water and an impeller. In this pump, the phenomenon that the space surrounded by the seal water pushed against the inner wall of the casing by centrifugal force and the rotating impeller varies is utilized to perform suction and discharge operations. In the present invention, the washing water W supplied from the water-washing unit 24 is used as the seal water for the water-sealed pump. Therefore, before passing through the water-sealed pump, the exhaust gas E that has undergone abatement treatment in the reaction tube 16 is brought into full gas-liquid contact with the washing water W to be reused as the seal water later. Thus, most of the water-soluble components in the exhaust gas E produced as a by-product of the abatement treatment are dissolved in the seal water and removed from the exhaust gas E. This means that there is no need to provide a water-washing device such as an outlet-side scrubber.

It should be noted that at the outlet of the downstream vacuum pump 22, a separator 45 such as a gas-liquid separator coalescer is optionally provided to separate the treated exhaust gas E and the seal water in their mixture discharged from the downstream vacuum pump 22 (see FIG. 1).

Here, the reduced pressure created by the downstream vacuum pump 22 for the exhaust gas flow region located downstream of the outlet of the vacuum pump 14 and including the interior of the reaction tube 16 is preferably in a range of 1 Torr or more and 700 Torr or less, more preferably in a range of 15 Torr or more and 685 Torr or less, and even more preferably in a range of 100±50 Torr. When the reduced pressure is lower than 1 Torr, an expensive and elaborate system is needed to achieve a high vacuum environment. In contrast, when the reduced pressure is higher than 700 Torr, which is close to the atmospheric pressure, the exhaust gas E must be diluted with a large amount of nitrogen gas, which is comparable to the amount of nitrogen gas required to dilute the exhaust gas E under atmospheric pressure.

The apparatus 10 for exhaust gas abatement under reduce pressure according to the present embodiment further includes a dust removal unit 28 provided in the reaction tube 16.

This dust removal unit 28 is composed of: a motor 44 disposed directly below the reaction tube 16; a rotatable arm 46 fixed upright to the motor 44 to extend upward into the reaction tube 16; and dust removable arms 48 branching from the upper end of the rotatable arm 46 and extending upward along the outer surface of the electric heater 18. Thus, the dust removal unit 28 is configured to blow away dust particles deposited on the inner surface of the reaction tube 16 and the outer surface of the electric heater 18. The dust particles are very fine fluffy particles and fall off upon brief contact with the rotating dust removable arms 48.

It is needless to say that the apparatus 10 for exhaust gas abatement under reduced pressure according to the present embodiment includes various types of detectors, controllers, and power supplies that are necessary to operate the electric heater 18, the downstream vacuum pump 22, the dust removal unit 28, and others, although not shown in the figures.

A method for exhaust gas E abatement under reduced pressure using the apparatus 10 for exhaust gas abatement under reduced pressure configured as described above will be described. The exhaust gas E discharged from the exhaust gas source 12 is delivered to the reaction tube 16 via the vacuum pump 14. When the downstream vacuum pump 22 is operated, the exhaust gas E is introduced into the exhaust gas treatment space 16a of the reaction tube 16 under a predetermined reduced pressure, and in this exhaust gas treatment space 16a, the exhaust gas E is subjected to decomposition/reaction treatment by the heat generated by the electric heater 18.

According to the apparatus 10 for exhaust gas abatement under reduced pressure of the present embodiment, the exhaust gas E is heated by the electric heater 18 for decomposition and/or reaction treatment under reduced pressure, and thus, less heat is generated by the reaction and a rapid temperature rise or explosive reaction never occurs. Therefore, there is no need to use diluent nitrogen gas or the use of the nitrogen gas can be reduced to a minimum. Since there is no need to dilute with diluent nitrogen gas or the use of the nitrogen gas can be reduced to a minimum, almost all thermal energy supplied by the electric heater 18 can be used directly for decomposition/reaction of the exhaust gas E. A combination of these two advantageous effects allow the exhaust gas E abatement apparatus to be configured very compactly.

In addition, since the region located downstream of the outlet of the exhaust gas source 12 and including the abatement treatment unit is under reduced pressure, even if the exhaust gas E contains toxic substances to humans, there is no risk that the exhaust gas E leaks from the system before being heated by the electric heater 18 for decomposition/ reaction treatment.

Figure 3:
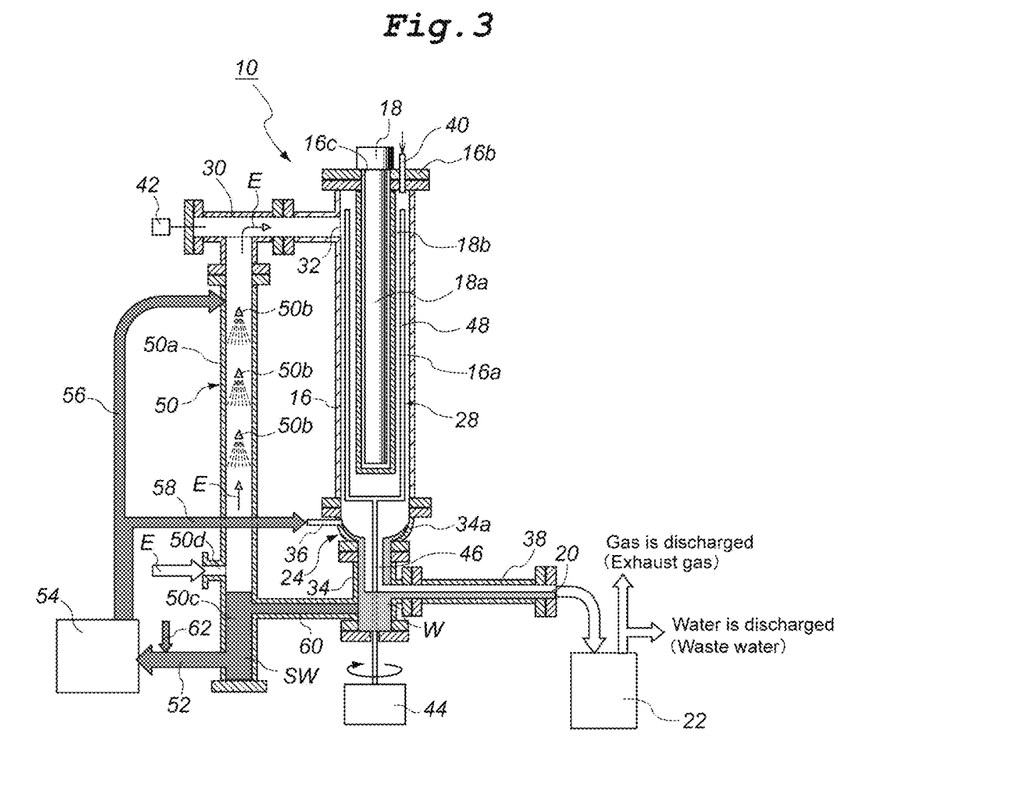
FIG. 3 is a configuration diagram showing an overview of an apparatus for exhaust gas abatement under reduced pressure according to another embodiment (second embodiment) of the present invention.

Next, another embodiment (second embodiment) of the present invention shown in FIG. 3 will be described. The main difference between the above-described apparatus 10 for exhaust gas abatement under reduced pressure according to the first embodiment and the apparatus of the second embodiment is that the latter apparatus is provided with an inlet-side scrubber 50 and its ancillary equipment on the upstream side of the reaction tube 16 in the flow path of the exhaust gas E supplied from the exhaust gas source 12 via the vacuum pump 14. The apparatus of the second embodiment is the same as the apparatus 10 for exhaust gas abatement under reduced pressure according to the first embodiment except for these scrubber and ancillary equipment. Therefore, description overlapping the description of the first embodiment is not repeated herein for the second embodiment.

The inlet-side scrubber 50 is a wet scrubber for washing dust particles and water-soluble components contained in the exhaust gas E with water in a reduced pressure atmosphere before the exhaust gas E is introduced into the reaction tube 16, and includes: a straight tube type scrubber main body 50a; and one or a plurality of spray nozzles 50b disposed inside the scrubber main body 50a so as to spray a mist of a chemical solution such as scrubber water SW. The scrubber main body 50a is mounted upright with its central axis extending in the vertical direction, and a reservoir 50c for storing the scrubber water SW is formed in the lower end portion of the scrubber main body 50a. An upstream end of a pipe 52 for drawing the scrubber water SW from the reservoir 50c is connected to the lower part of the outer surface of the reservoir 50c to communicate with the reservoir 50c, and the downstream end of the pipe 52 is connected to the inlet of a circulation pump 54.

The circulation pump 54 is a pump for circulating the scrubber water SW, and the upstream end of a pipe 56 is connected to the outlet of the circulation pump 54 to supply the scrubber water SW to various parts. The downstream end of the pipe 56 is connected to the spray nozzle(s) 50b in the scrubber main body 50a. This pipe 56 branches in the middle to form a branch pipe 58, and the downstream end of the branch pipe 58 is connected to the washing-water supply nozzle 36. Therefore, a portion of the scrubber water SW circulated by the circulation pump 54 is used as washing water W in the above-mentioned water-washing unit 24.

An exhaust gas inlet 50d for introducing the exhaust gas E into the scrubber main body 50a is formed at a position higher than the water level in the reservoir 50c located in the lower part of the scrubber main body 50a.

Furthermore, the reservoir 50c of the scrubber main body 50a and a trap for the washing water W in the lower part of the casing 34 of the water-washing unit 24 are configured to communicate with each other via a pipe 60. Therefore, a portion of the washing water W supplied to the water-washing unit 24 through the branch pipe 58 is used as seal water for the downstream vacuum pump 22 but all the rest of the washing water W is returned to the reservoir 50c through the pipe 60 and recirculated as the scrubber water SW or the washing water W by the circulation pump 54.

It should be noted that the amount of the scrubber water SW and washing water W circulated for reuse by the circulation pump 54 decreases as a portion thereof is used as the seal water for the downstream vacuum pump 22, but the total amount of water in the apparatus is controlled in a well-balanced manner by supplying additional new (unused) water through a water supply pipe 62 connected to the downstream portion of the pipe 52 to compensate the loss of the seal water.

The upper end of the scrubber main body 50a is configured to communicate with the exhaust gas inlet 32 of the reaction tube 16 through a pipe 30.

According to the apparatus 10 for exhaust gas abatement under reduced pressure of the present embodiment configured as described above, the above-mentioned operational effects can be achieved. In addition, since the reservoir 50c of the scrubber main body 50a and the trap for the washing water W in the lower part of the casing 34 of the water-washing unit 24 are connected to communicate with each other via the pipe 60, the washing water W trapped in the lower part of the casing 34 of the water-washing unit 24 can also be circulated by the circulation pump 54. As a result, the amount of the washing water W to be ejected from the washing water supply nozzle 36 of the water-washing unit 24 can be increased and thus the cleaning ability of the water-washing unit 24 can be enhanced.

Figure 4:
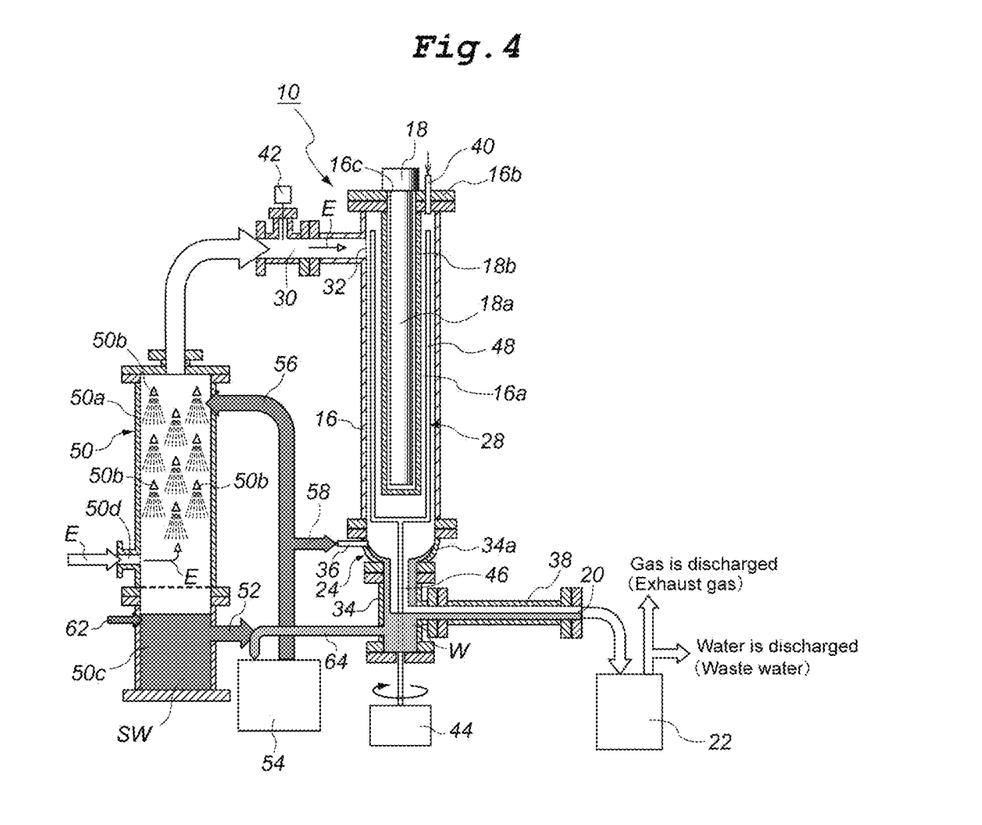
FIG. 4 is a configuration diagram showing an overview of an apparatus for exhaust gas abatement under reduced pressure according to still another embodiment (third embodiment) of the present invention.

Next, still another embodiment (third embodiment) of the present invention shown in FIG. 4 will be described. In this apparatus 10 for exhaust gas abatement under reduced pressure of the third embodiment, the inlet-side scrubber 50 is provided on the upstream side of the reaction tube 16 in the exhaust gas E flow path, as in the second embodiment described above, but the third embodiment differs from the second embodiment in the locations of the circulation pump 54 and the water supply pipe 62. Since the apparatus of the third embodiment is the same as the apparatus 10 for exhaust gas abatement under reduced pressure according to the first or second embodiment except for the locations of the circulation pump 54 and the water supply pipe 62, description overlapping the description of the first and second embodiments is not repeated herein for the third embodiment.

In the present embodiment, not only the downstream end of the pipe 52 for drawing the scrubber water SW from the reservoir 50c but also the downstream end of the pipe 64 for drawing the washing water W trapped in the lower part of the casing 34 of the water-washing unit 24 is connected to the inlet of the circulation pump 54. Therefore, unlike in the apparatus of the second embodiment, the pipe 60 for communicating the reservoir 50c of the scrubber main body 50a and the lower part of the casing 34 of the water-washing unit 24 is not provided in the apparatus 10 for exhaust gas abatement under reduced pressure according to the present embodiment.

Furthermore, the water supply pipe 62 of the present embodiment is connected directly to the reservoir 50c of the scrubber main body 50a so as to supply additional new water directly to the reservoir 50c.

Since the apparatus 10 for exhaust gas abatement under reduced pressure according to the present embodiment is configured to supply the washing water W trapped in the lower part of the casing 34 of the water-washing unit 24 directly to the suction port of the circulation pump 54 through the pipe 64, the amount of the washing water W to be ejected from the washing water supply nozzle 36 of the water-washing unit 24 can be further increased and thus the cleaning ability of the water-washing unit 24 can be further enhanced than in the apparatus of the second embodiment described above.

The following modifications may be made to the embodiments described above.

In the above embodiments, the electric heater 18 is used as the heat source for thermal decomposition of the exhaust gas E in the reaction tube 16, but instead, a plasma such as a DC arc plasma, an inductively coupled plasma, or a capacitively coupled plasma (not shown) may be used.

In the above embodiments, the water-washing unit 24 is composed of the casing 34 having a predetermined shape and the washing water supply nozzle 36, but the water-washing unit 24 may be configured in any suitable manner as long as the downstream end portion of the exhaust gas flow path in the reaction tube 16 can be washed with the washing water W, and the configuration of the water-washing unit 24 is not limited to that described above.

In the above embodiments, at least one selected from the group consisting of water, air, $O_2$, $H_2$, and hydrocarbon gases is given as an example of the decomposition/reaction agent supplied from the decomposition/reaction agent supply unit 26. However, for example, when the exhaust gas E contains a large amount of perfluorinated compounds (PFCs) such as $NF_3$ and thus a large amount of HF is produced as a decomposition/reaction product, it is preferable to add an alkaline aqueous solution such as a KOH aqueous solution or a NaOH aqueous solution as a neutralizer (decomposition/reaction agent).

In the above embodiments, the dust removal unit 28 as an optional component is composed of the motor 44, the rotatable arm 46, and the dust removable arms 48, but this dust removal unit 28 may be configured in any suitable manner as long as dust particles deposited in the interior of the reaction tube 16 can be removed, and the configuration of the dust removal unit 28 is not limited to that described above.

In the above embodiments, the vacuum pump 14 and the exhaust gas inlet 32 of the reaction tube 16 are connected by the pipe 30. However, the outlet of the vacuum pump 14 and the exhaust gas inlet 32 may be connected directly to each other. Furthermore, in the above embodiments, the exhaust gas outlet 20 of the reaction tube 16 and the inlet of the downstream vacuum pump 22 are connected directly to each other. However, the exhaust gas outlet 20 of the reaction tube 16 and the downstream vacuum pump 22 may be connected by a pipe.

It will be understood that various modifications may be made to the above embodiments within the scope of knowledge of those skilled in the art.

REFERENCE SIGNS LIST

10: Apparatus for exhaust gas abatement under reduced pressure
12: Exhaust gas source
14: Vacuum pump
16: Reaction tube
16a: Exhaust gas treatment space
18: Electric heater
20: Exhaust gas outlet
22: Downstream vacuum pump
24: Water-washing unit
26: Decomposition/reaction agent supply unit
28: Dust removal unit
50: Inlet-side scrubber
54: Circulation pump
E: Exhaust gas
W: Washing water
SW: Scrubber water

The invention claimed is:

1. An apparatus for exhaust gas abatement under reduced pressure, comprising:
a reaction tube having, in an interior thereof, an exhaust gas treatment space in which an exhaust gas supplied from an exhaust gas source via a vacuum pump is heated by an electric heater or excited by a plasma for decomposition and/or reaction treatment; and
a downstream vacuum pump that is connected to an exhaust gas outlet located downstream of the reaction tube to reduce a pressure in a region located downstream of an outlet of the vacuum pump and including the interior of the reaction tube, wherein
the downstream vacuum pump is a water-sealed pump,
the apparatus further comprises a water-washing unit for washing a downstream end of an exhaust gas flow path in the reaction tube with washing water, and
the washing water supplied by the water-washing unit to wash the downstream end of the exhaust gas flow path in the reaction tube is reused as seal water for the downstream vacuum pump.

2. The apparatus for exhaust gas abatement under reduced pressure according to claim 1, further comprising a decomposition/reaction agent supply unit for supplying at least one selected from the group consisting of water, air, $O_2$, $H_2$, and hydrocarbon gases, as a decomposition/reaction agent, to the interior of the reaction tube.

3. The apparatus for exhaust gas abatement under reduced pressure according to claim 1, further comprising a dust removal unit that is provided in the interior of the reaction tube to remove dust particles deposited therein.

4. The apparatus for exhaust gas abatement under reduced pressure according to claim 1, further comprising an inlet-side scrubber that is a wet scrubber for washing the exhaust gas with water in a reduced pressure atmosphere before the exhaust gas is introduced into the reaction tube.

5. The apparatus for exhaust gas abatement under reduced pressure according to claim 4, further comprising a circulation pump for circulating scrubber water for use in the inlet-side scrubber, a portion of the circulating scrubber water being supplied to the water-washing unit for use as the washing water therein.

* * * * *